United States Patent [19]

Gazdik et al.

[11] Patent Number: 4,855,867

[45] Date of Patent: Aug. 8, 1989

[54] FULL PANEL ELECTRONIC PACKAGING STRUCTURE

[75] Inventors: Charles E. Gazdik, Endicott; Donald G. McBride, Binghamton; Donald P. Seraphim, Vestal, all of N.Y.; Patrick A. Toole, Westport, Conn.

[73] Assignee: International Business Machines Corporation, Armonk, N.Y.

[21] Appl. No.: 151,382

[22] Filed: Feb. 2, 1988

Related U.S. Application Data

[62] Division of Ser. No. 9,981, Feb. 2, 1987, Pat. No. 4,766,670.

[51] Int. Cl.$^4$ .................................................. H05K 7/20
[52] U.S. Cl. .................................... 361/306; 165/80.3; 357/81; 361/388; 361/398; 361/414
[58] Field of Search ................................ 165/80.3, 185; 174/16 HS; 357/80, 81; 361/386-388, 398, 413-414

[56] References Cited

U.S. PATENT DOCUMENTS

| | | | |
|---|---|---|---|
| 3,440,027 | 4/1969 | Hugle | 29/193.5 |
| 3,501,832 | 3/1970 | Iwata et al. | 29/626 |
| 3,582,865 | 6/1971 | Franck | 339/17 |
| 3,614,832 | 10/1971 | Chance et al. | 29/626 |
| 3,683,105 | 8/1972 | Shamash et al. | 174/68.5 |
| 3,689,991 | 9/1972 | Aird | 29/577 |
| 3,781,596 | 12/1973 | Galli et al. | 361/398 |
| 3,859,723 | 1/1975 | Hamer et al. | 29/626 |
| 3,968,563 | 7/1976 | Hamlin | 29/591 |
| 4,063,993 | 12/1977 | Burns | 156/659 |
| 4,222,516 | 9/1980 | Badet et al. | 235/492 |
| 4,231,154 | 11/1980 | Gazdik et al. | 29/840 |
| 4,251,852 | 2/1981 | Ecker et al. | 361/386 |
| 4,283,839 | 8/1981 | Gursky | 29/589 |
| 4,377,316 | 3/1988 | Ecker et al. | 339/17 CF |
| 4,386,116 | 5/1983 | Nair et al. | 427/99 |
| 4,386,389 | 5/1988 | Proebsting | 361/406 |
| 4,480,288 | 10/1984 | Gazdik et al. | 361/398 |
| 4,517,051 | 5/1985 | Gazdik et al. | 156/644 |
| 4,549,200 | 10/1985 | Ecker et al. | 357/80 |
| 4,681,654 | 7/1987 | Clementi et al. | 156/630 |

FOREIGN PATENT DOCUMENTS 51-054268 5/1976 Japan.
53-061661 6/1978 Japan.
53-149764 12/1978 Japan.

OTHER PUBLICATIONS

Gazdik, C. E., et al., "Processing PC Conductor Decals", *IBM Technical Disclosure Bulletin*, vol. 21, No. 11, Apr. 1979, p. 4425 (IBM Corp., Armonk, N.Y. 10504).

Egitto, F. D., et al., "Plasma Etching of Organic Materials, I. Polyimide in 02-CF4", *J. Vac. Sci. Technology*, B 3 (3), May/Jun. 1985, pp. 893-904.

Ho, C. W., et al., "Chip Attachment Structure for High Performance Efficiently Cooled Semiconductor Chip Carriers", *IBM Technical Disclosure Bulletin*, vol. 25, No. 5, Oct.1982, p. 2544 (IBM Corp., Armonk, N.Y. 10504).

Edwards, J. C., "Chi Attachment to Tape and Cable", *IBM Technical Bulletin*, vol. 25, No. 4, Sep. 1982, p. 1954 (IBM Corp., Armonk, N.Y. 10504).

*Primary Examiner*—Gregory D. Thompson
*Attorney, Agent, or Firm*—Pollock, Vande Sande & Priddy

[57] ABSTRACT

An electronic packaging structure, and a method of making this structure, are disclosed. The electronic packaging structure comprises a full panel, circuitized flexible film semiconductor chip carrier mounted on a circuitized substrate such as a printed circuit board. A plurality of semiconductor chips are mounted on the carrier in a selected pattern, and the carrier, with the chips, is mounted on a matching pattern of bonding sites on the circuitized substrate. Preferably, the circuitized flexible film semiconductor chip carrier is manufactured on a support structure used to facilitate handling of the circuitized flexible film and to facilitate heat transfer from the semiconductor chips mounted on the carrier to a heat sink which is part of the circuitized substrate. Also, the semiconductor chips mounted on the flexible film chip carrier may be tested, and burned in, while on the support structure before the chip carrier, with the chips, is mounted on the circuitized substrate.

8 Claims, 4 Drawing Sheets

FULL PANEL ELECTRONIC PACKAGING STRUCTURE

This is a divisional of co-pending patent application Ser. No. 009,981, filed on Feb. 2, 1987, and now U.S. Pat. No. 4,766,670.

BACKGROUND OF THE INVENTION

The present invention relates to electronic packaging, and, more particularly, relates to structures for electronic packaging of semiconductor chips, and to methods for making such electronic packaging structures.

Typically, semiconductor chips are mounted on circuitized substrates, known as semiconductor chip carriers, having electrical circuit lines for connecting the chip to a printed circuit board, or other such electronic structure, which may be used as part of a computer, or other such equipment. For example, in many applications, it is desirable to mount several semiconductor chip carriers, each housing at least one semiconductor chip, on one printed circuit board. Typically, the several semiconductor chip carriers, with their semiconductor chips, are interconnected electrically by the circuitry of the printed circuit board.

In a relatively high volume manufacturing environment, there is a need to reliably and cost-effectively manufacture such printed circuit boards, and other such structures, with a plurality of semiconductor chips mounted thereon. These manufacturing goals become increasingly more difficult to reach as the number and complexity of the semiconductor chips which it is desired to mount on one printed circuit board, or other such structure, increases.

SUMMARY OF THE INVENTION

Therefore, an object of the present invention is to provide an electronic packaging structure for reliably and cost-effectively mounting a plurality of electronic devices on a printed circuit board or other such structure.

Another object of the present invention is to provide a method for making such an electronic packaging structure which is suitable for use in a relatively high volume manufacturing environment.

These and other objects of the present invention are attained by an electronic packaging structure comprising a full panel flexible film chip carrier having a plurality of semiconductor chips, or other such electronic devices, mounted thereon in a selected pattern. This full panel flexible film chip carrier is mounted on a circuitized substrate, such as a printed circuit board, having a plurality of bonding sites, electrically interconnected by the circuit lines of the substrate, and arranged in a pattern which matches the pattern of the semiconductor chips mounted on the full panel flexible film chip carrier. Preferably, the full panel flexible film chip carrier is an integral, flexible sheet of polyimide sized to cover all of the bonding sites on the circuitized substrate, and having circuitry on at least one side with lands for interconnecting the circuitry of the polyimide layer to the bonding sites on the circuitized substrate.

The foregoing electronic packaging structure is especially suited for manufacture in a relatively high volume manufacturing environment by a method which comprises mounting a full panel circuitized flexible film, with a plurality of electronic devices mounted thereon in a selected pattern, to a circuitized substrate having a plurality of bonding sites, electrically interconnected with circuit lines, and arranged in a pattern which matches the pattern of the electronic devices on the circuitized flexible film. Preferably, the circuitized flexible film is formed on a support structure which may be used to facilitate handling of the circuitized flexible film before it is mounted on the circuitized substrate, and which may be used to facilitate heat transfer from the electronic devices mounted on the circuitized flexible film to a heat sink which is part of the circuitized substrate. Also, preferably, the electronic devices mounted on the circuitized flexible film are tested and burned in while on the support structure before the circuitized flexible film is mounted on the circuitized substrate.

BRIEF DESCRIPTION OF THE DRAWING

Other objects and advantages of the present invention will be apparent from the following description in conjunction with the accompanying drawing, in which like reference numerals identify like elements, and in which.

DESCRIPTION OF THE PREFERRED EMBODIMENT

Figure 1:
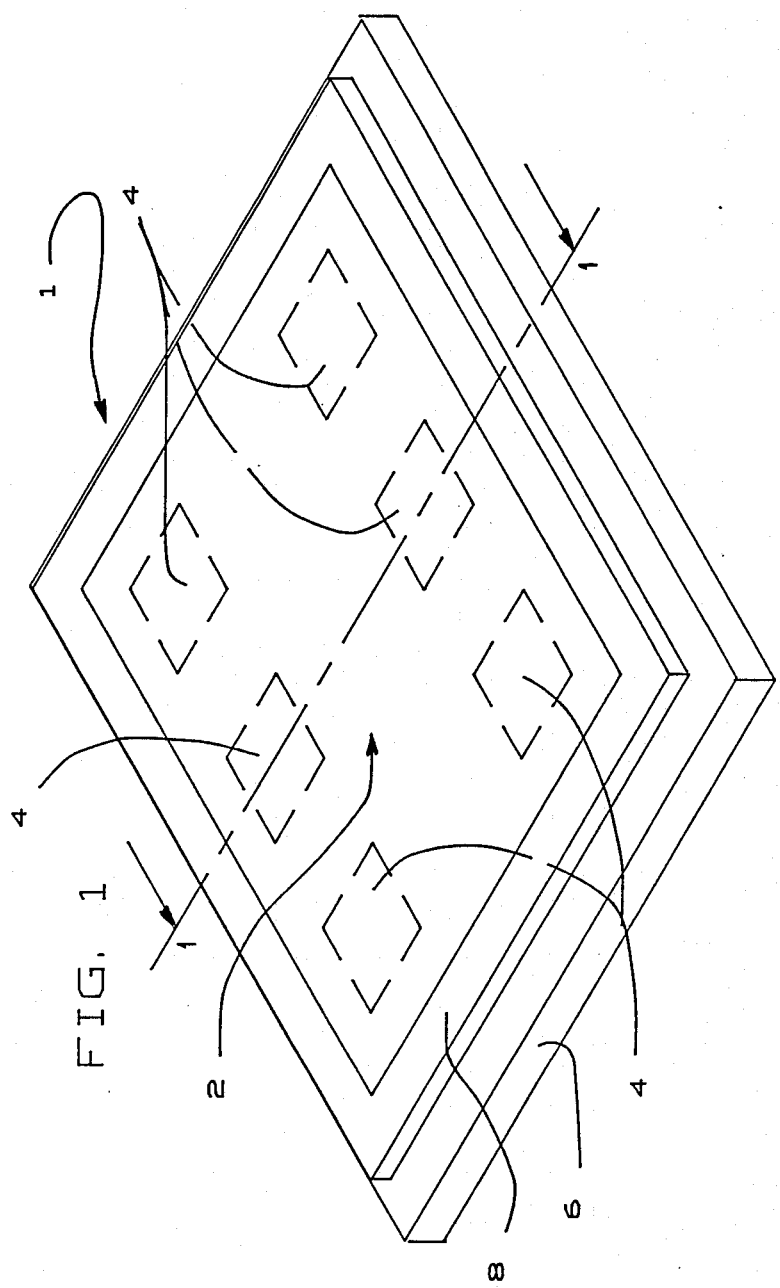
FIG. 1 is a perspective view of an electronic packaging structure in accordance with the principles of the subject invention, comprising a full panel circuitized flexible film with a plurality of semiconductor chips mounted on a printed circuit board.

Referring to FIG. 1, a perspective view is shown of an electronic packaging structure 1 in accordance with the principles of the present invention. As shown in FIG. 1, the electronic packaging structure 1 comprises a full panel, circuitized, flexible film 2 attached to a frame 8 with a plurality of semiconductor chips 4 in a selected pattern mounted on a printed circuit board 6 made of a dielectric material, such as glass cloth impregnated with epoxy resin. If desired, the circuit board 6 may be a multilayer structure having several signal planes, ground planes, etc. For clarity, the circuitry on the flexible film 2, and the circuitry on the printed circuit board 6, have not been shown in FIG. 1. Also, for ease of illustration, no attempt has been made to draw to scale the electronic packaging structure 1 shown in FIG. 1 or the structures shown in the other Figures.

Figure 2:
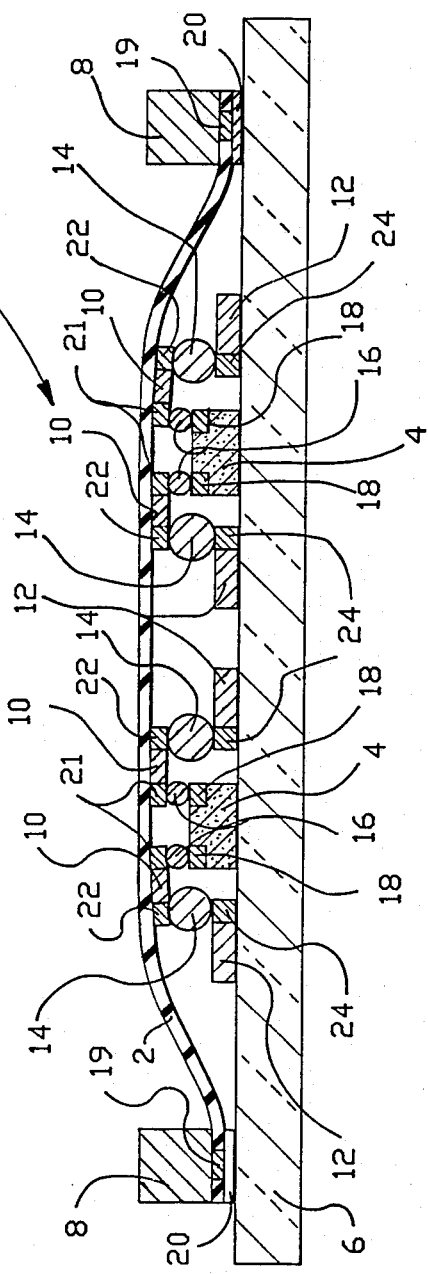
FIG. 2 is a cross-sectional view taken along line 1—1 of the electronic packaging structure shown in FIG. 1.

FIG. 2 is a cross-sectional view taken along line A—A of the electronic packaging structure 1 shown in FIG. 1. FIG. 2 shows portions of the circuit lines 10 on the flexible film 2 and portions of the circuit lines 12 on the circuit board 6. Also, FIG. 2 shows interconnections 14 between lands 24 of the circuit lines 12 on the circuit board 6 and lands 22 of the circuit lines 10 on the flexible film 2. In addition, FIG. 2 shows interconnections 16 (solder balls which are part of controlled collapse chip connections (C-4)) between pads 21 of the circuit lines 10 on the flexible film 2 and terminals 18 of the semiconductor chips 4. For ease of illustration in FIG. 2, only a portion is shown of each of the circuit lines 10 on the flexible film 2, and of each of the circuit lines 12 on the circuit board 6. FIG. 2 also shows a heat sink 20 which is part of the circuit board 6, and heat conducting vias 19 filled with a heat conducting material, such as copper, for conducting heat from the flexible film 2 to the frame 8 and the heat sink 20.

Figure 3:
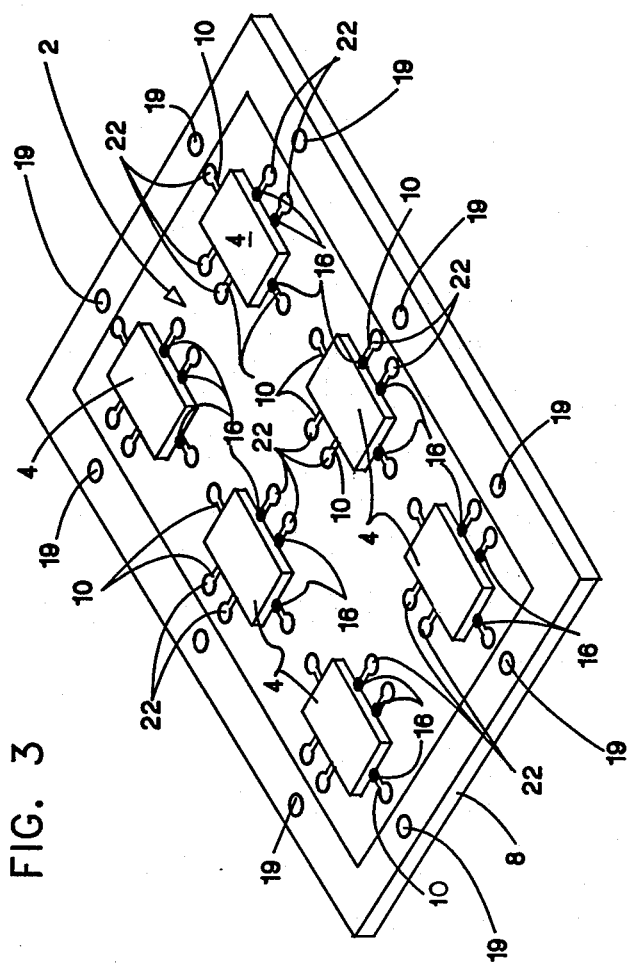
FIG. 3 is a perspective view of the full panel circuitized flexible film with the plurality of semiconductor chips shown in FIG. 1.

Referring to FIG. 3, a perspective view is shown of the full panel, circuitized, flexible film 2 attached to the frame 8 with the plurality of semiconductor chips 4 mounted thereon in the selected pattern shown in FIG. 1. FIG. 3 also shows the circuit lines 10 on top of the flexible film 2 which is attached to the top of the frame 8, and the heat conducting vias 19, filled with copper, in the flexible film 2. The semiconductor chips 4 are mounted on the pads 21 (see FIG. 2) of the circuit lines 10 through the interconnections 16 (also shown in FIG. 2) which physically and electrically connect the semiconductor chips 4 to the circuit lines 10 on the flexible film 2. FIG. 3 also shows the lands 22 of the circuit lines 10 used in connecting the circuit lines 10 on the flexible film 2 to the lands 24 of the circuit lines 12 on the circuit board 6 (also, see FIGS. 2 and 4). For clarity, only some of the lands 22 and circuit lines 10 in FIG. 3 have been labelled. FIG. 1 shows the flexible film 2 with the semiconductor chips 4 mounted on the top surface of the circuit board 6.

Figure 4:
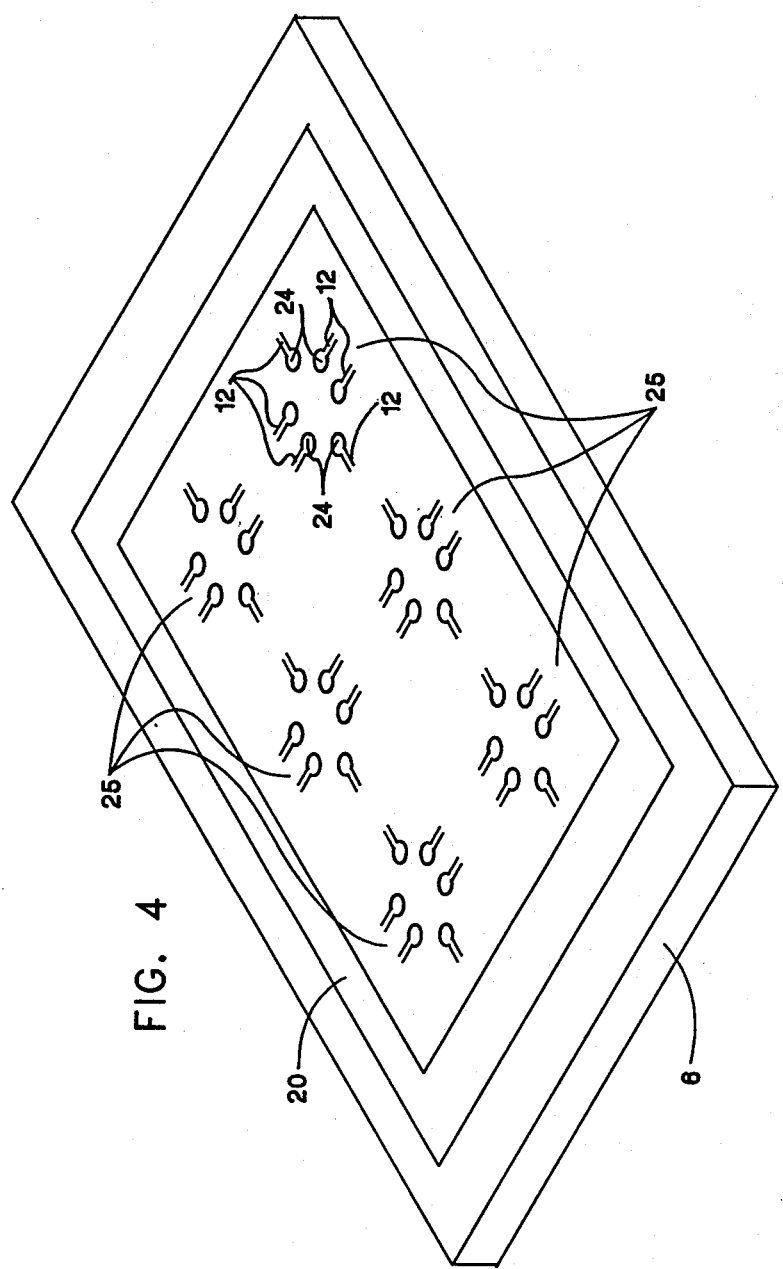
FIG. 4 is a perspective view of the printed circuit board shown in FIG. 1.

FIG. 4 is a perspective view of the printed circuit board 6 shown in FIG. 1. FIG. 4 shows the circuit lines 12 on the printed circuit board 6 with the lands 24 forming bonding sites 25 arranged in a pattern which matches the pattern of the semiconductor chips 4 mounted on the flexible film chip carrier 2. The bonding sites 25 are the locations where the circuit lines 12 on the printed circuit board 6 are connected to the circuit lines 10 on the flexible film 2. For clarity and ease of illustration, in FIG. 4, only a portion of each of the circuit lines 12 on the printed circuit board 6 is shown, and only some of the lands 24 and the circuit lines 12 have been labelled. However, it should be noted that, preferably, the circuit lines 12 on the printed circuit board 6 electrically interconnect the lands 24 of different bonding sites 25 thereby electrically interconnecting the semiconductor chips 4 on the full panel, circuitized, flexible film 2 when the film 2 with the chips 4 is mounted on the circuit board 6.

Preferably, the flexible film 2 attached to the frame 8 shown in FIGS. 1, 2, and 3, is a relatively thin sheet of polyimide. For example, the flexible film 2 may be a sheet of polyimide having a thickness between approximately 5.1 to 7.6 microns (about 0.0002 to 0.0003 inch), a width of approximately 177.8 millimeters (about 7 inches), and a length of approximately 228.6 millimeters (about 9 inches). For most applications, the polyimide should have a thickness of less than approximately 12.7 microns (about 0.0005 inch) to provide stress relief during thermal cycling of the polyimide when manufacturing and using the electronic packaging structure 1. However, the polyimide should not be so thin that it loses its structural integrity such that the polyimide cannot function as a structurally continuous dielectric layer. For some applications, it may be desirable for the polyimide layer 2 to have a thickness between approximately 12.7 and 25.0 microns (about 0.0005 and 0.001 inch). However, to provide the thermal stress relief mentioned previously, when using C-4 as the interconnections 16, it is preferred that the polyimide not have a thickness greater than approximately 25.0 microns (about 0.001 inch). When using other types of interconnections 16, it may be feasible, and desirable in certain situations, to use a thicker polyimide layer 2. For example, if a thermal compression bonding technique is used to make the interconnections 16, then the polyimide layer 2 may have a thickness of up to approximately 128.2 microns (about 0.005 inch).

There may be a preferred width and length for the polyimide forming the flexible film 2 depending on the capabilities of the equipment available for handling the film 2. Otherwise, the polyimide forming the flexible film 2 may virtually have any desired width and length which is reasonable from the viewpoint of handling the flexible film 2.

The polyimide forming the flexible film 2 may be any one of a number of specific materials. For example, "5878" polyimide (PMDA-ODA type) available from E. I. Du Pont de Nemours and Company may be used. This "5878" polyimide is a thermo set condensation polymer polyimide, which is basically a high temperature, elastic material. That is, it is capable of withstanding processing temperatures up to approximately 400 degrees centigrade, and may be stretched.

Preferably, the circuitry 10 on the flexible film 2 is relatively fine line circuitry with the individual circuit lines 10 having a thickness (height) of approximately 7.6 microns (about 0.0003 inch) and a width of approximately 25.4 microns (about 0.001 inch). However, it should be noted that the thickness and width of the circuit lines 10 may vary depending on factors such as the capabilities of the process used to form the circuitry on the flexible film 2, the planned use for the circuitry, and the performance characteristics expected of the circuitry and of the resulting full panel, circuitized flexible film 2.

Preferably, each of the filled heat conducting vias 19 in the flexible film 2 is a cylindrical structure having a diameter between approximately 256.4 microns (about 0.010 inch) and 512.8 microns (about 0.020 inch). The filled heat conducting vias 19 may be formed by electrolytic or electroless plating, sputtering, screening, or other such suitable process.

As shown in FIG. 3, the circuitry 10 on the flexible film 2 is patterned to provide six sites for mounting the semiconductor chips 4 on the circuitized flexible film 2 and for connecting the semiconductor chips 4 to the circuitry 12 on the circuit board 6. However, the circuitry 10 on the flexible film 2 may have virtually any desired pattern and may also provide electrical connections between the different semiconductor chips 4 mounted on the circuitized flexible film 2.

Preferably, the circuitry on the flexible film 2 comprises a chromium-copper-chromium (Cr-Cu-Cr) metallurgical system which is personalized using photolithographic and etching techniques such as described in U.S. Pat. Nos. 4,231,154, 4,480,288, and 4,517,051, assigned to International Business Machines Corporation, Armonk, N.Y., the disclosures of which are incorporated herein by this reference. Although, for ease of illustration, FIGS. 2 and 3 show circuitry only on one side of the flexible film 2, if desired, the flexible film 2 may have circuitry on both sides with interconnecting vias as described, for example, in the previously mentioned U.S. Pat. Nos. 4,480,288 and 4,517,051.

Preferably, the frame 8 for the full panel, circuitized flexible film 2 is made of a heat conductive material such as aluminum. As shown in FIGS. 1, 2, and 3, the frame 8 is rectangular and is attached to the edges of the full panel, circuitized flexible film 2. The frame 8 may include slots and/or notches (not shown) for registration of the frame 8 during manufacture of the circuitized flexible film 2 on the frame. Preferably, for use with a flexible film 2 having a width of approximately 177.8 millimeters (about 7 inches) and a length of approximately 228.6 millimeters (about 9 inches), the frame 8 is approximately 12.7 to 25.4 millimeters (about 0.5 to 1.0 inch) wide, and approximately 0.77 millimeters (about 0.030 inch) thick. If desired, the frame 8 may be configured in a "windowpane", or other such, structure with each "pane" of the frame 8 surrounding one of the areas of the flexible film 2 on which one of the semiconductor chips 4 is to be mounted. However, it should be noted that, in general, the frame 8 may have any one of a number of configurations depending on the equipment available for handling the frame 8, the use which it is desired to make of the frame 8, and other such factors.

The primary function for the frame 8 is to facilitate handling of the full panel, circuitized flexible film 2 during its manufacture and during mounting of the circuitized flexible film 2 on the circuit board 6. For example, the frame 8 may be a part of a temporary full panel, planar support on which the full panel, circuitized flexible film 2 is made. Then, all of the full panel, planar support, except for the frame 8, may be removed by a suitable process such as an etching process. For example, if the temporary full panel, planar support is made of aluminum, then hydrochloric acid can be used as an etchant, with a wax etchant mask protecting that part of the planar support which is to remain as the frame 8.

The frame 8 may also be used to transfer heat from the semiconductor chips 4 mounted on the circuitized flexible film 2 to the heat sink 20 which is part of the circuit board 6. FIG. 2 shows one way the frame 8 may be placed in thermal contact with the heat sink 20 of the circuit board 6 through the vias 19 filled with a heat conductive material, such as copper. Also, if desired, to enhance heat transfer between the semiconductor chips 4 and the frame 8, heat conducting circuit lines (not shown), which are electrically non-functional, may be used to thermally interconnect electrically non-functional terminals 18 of the semiconductor chips 4 to the frame 8 through selected ones of the heat conducting vias 19. These heat conducting circuit lines may be formed on the flexible film 2 at the same time as the circuit lines 10 are formed on the film 2.

Preferably, the heat sink 20 is a layer of a heat conductive material, such as copper, formed on the top surface of the printed circuit board 6 in a rectangular strip having approximately the same width as the frame 8 and having a thickness of approximately 35.9 microns (about 0.0014 inch). The heat sink 20 may be formed at the same time, and in the same manner, as the circuit lines 12 on the printed circuit board 6. The frame 8 with the heat conducting vias 19 may be attached to the heat sink 20 at the same time, and in the same manner, as the circuitized flexible film 2 with the semiconductor chips 4 is mounted on the circuit board 6.

Alternatively, in lieu of, or in addition to, using the frame 8 to transfer heat from the semiconductor chips 4 mounted on the circuitized flexible film 2 to the heat sink 20, and/or to the printed circuit board 6, heat conductive studs (not shown) may be formed in the printed circuit board 6 at locations beneath the semiconductor chips 4 such that, when the flexible film 2 with the semiconductor chips 4 is mounted on the printed circuit board 6, the heat conductive studs are in thermal contact with the tops of the semiconductor chips 4 which are facing the top surface of the printed circuit board 6.

Although FIGS. 1–3 show semiconductor chips 4 mounted on the circuitry 10 of the flexible film 2, it should be noted that, if desired, other kinds of electronic devices may be mounted on the circuitry 10 of the flexible film 2. For example, capacitors, resistors, and/or other such devices, may be mounted on some or all of the semiconductor chip mounting sites on the circuitized flexible film 2. Also, it should be noted that, if desired, the flexible film 2 may simply have circuitry 10 thereon, without any devices mounted thereto, such that the flexible film 2 with the circuitry 10 may be used as a cable, or "cross over", for interconnecting the circuit lines 12 on the printed circuit board 6 when the flexible film 2 with the circuitry 10 is mounted on the circuit board 6.

As shown in FIGS. 2 and 3, each of the semiconductor chips 4 is mounted on the circuitry 10 of the flexible film 2 using the interconnections 16 between the pads 21 on the flexible film 2 and the terminals 18 of the semiconductor chips 4. Preferably, the interconnections 16 are solder balls which are part of controlled collapse chip connections (C-4) for attaching each of the semiconductor chips 4 to the circuitry 10 on the flexible film 2 in an area or peripheral array attachment configuration. However, if desired, other techniques, such as thermal compression bonding or ultrasonic bonding, may be used to mount the semiconductor chips 4, or other electronic devices, on the circuitry 10 of the flexible film 2.

Also, as shown in FIGS. 2 and 3, the interconnections 14 electrically and physically interconnect the lands 22 of the circuitry 10 of the flexible film 2 to the lands 24 of the circuitry 12 on the circuit board 6. Any suitable outer lead bonding technique may be used to make the interconnections 14. For example, the interconnections 14 may be made using a thermal compression bonding technique such as used in tape automated bonding (TAB).

As shown in FIGS. 1, 2 and 4, the circuitized flexible film 2 with the semiconductor chips 4 is shown mounted on a printed circuit board 6 made of a dielectric material such as glass cloth impregnated with epoxy resin. However, it should be noted that, if desired, the circuitized flexible film 2 with the semiconductor chips 4, or other electronic devices, may be mounted on any one of a number of different kinds of substrates, such as a ceramic, plastic, or other such substrate.

Preferably, the circuitry 12 on the circuit board 6 is formed using conventional photolithographic techniques. Each of the circuit lines 12 may be made of copper approximately 76 microns wide (about 0.003 inch), and having a thickness (height) of approximately 35.9 microns (about 0.0014 inch). For clarity and ease of illustration in FIGS. 2 and 4, only part of the circuitry 12 on the circuit board 6 is shown. It should be noted that the circuitry 12 may electrically interconnect some, none, or all of the semiconductor chips 4 on the circuit board 6, and, in general, may have any one of a variety of designs and configurations depending on the application for the electronic packaging structure 1. For example, if each of the circuit lines is approximately 76 microns wide (about 0.003 inch), then they may fan out in a grid having an approximately 250 microns (about 0.010 inch) separation between the circuit lines 12 at the semiconductor chip 4 bonding sites 25 to a grid having an approximately 1250 microns (about 0.050 inch), or an approximately 2500 microns (about 0.100 inch) separation between the circuit lines 12 at the locations on the circuit board 6 away from the bonding sites 25.

Preferably, according to the principles of the present invention, the previously described electronic packaging structure 1 is made by the following process. First, a flexible polymer film 2, such as the Du Pont "5878" polyimide mentioned previously, is applied to a panel of metal foil made of aluminum, copper, or other such material. The metal foil panel is sized to cover the circuit board 6, or other such substrate, on which the circuitized flexible film 2 is to be mounted. For example, the metal foil may be made a rectangular sheet of aluminum having a width of approximately 177.8 millimeters (about 7 inches), a length of approximately 228.6 millimeters (about 9 inches), and a thickness of approximately 127 microns (about 0.005 inch).

The polyimide may be applied to the metal foil by coating it on the foil in an uncured (unimidized) liquid form using a conventional spray, roller coater, or squeegy type application technique. However, any other suitable technique for applying the polyimide to the metal foil may be used, if desired.

The polyimide may be further processed directly on the metal foil or transferred to a full panel carrier frame using a transfer process such as described in United States patent application Ser. No. 865,316, assigned to International Business Machines Corporation, entitled "Flexible Film Semiconductor Chip Carrier" which was filed in the U.S. Patent and Trademark Office on May 21, 1986, the entire disclosure of which is incorporated herein by this reference.

After the polyimide is applied to the metal foil or the carrier frame, it is fully cured (fully imidized) to a "C" stage, such that approximately 100% of the polyimide is imidized. For example, if the flexible polyimide film is the Du Pont "5878" polyimide which is to have a thickness of approximately 5.1 microns to 7.6 microns, then the liquid polyimide may be fully cured by heating at a temperature of approximately 360 to 400 degrees centigrade for approximately 30 minutes. If the polyimide is fully cured on the metal foil then the next step is to remove all of the metal foil except for that part of the foil forming the frame 8 for handling the flexible film 2. For example, the metal foil may be removed by etching in the presence of a wax etchant mask as described previously. Of course, if the polyimide is transferred to a carrier frame using the transfer process referenced above, the carrier frame used in this process is selected to have the configuration shown for the frame 8 in FIGS. 1, 3, and 4.

After the preceding steps, the fully cured polyimide flexible film 2 on the frame 8 is first metallized, then circuitized, and the semiconductor chips 4, or other such devices, are mounted on the circuitry 10 on the flexible film 2 as described previously. The semiconductor chips 4 may be mounted on the circuitized polyimide flexible film 2 by a conventional C-4 solder reflow process, or by any other such suitable process. The resulting structure is shown in FIG. 3.

The semiconductor chips 4 may be tested and "burned in" while the circuitized, polyimide flexible film 2 is still in the frame 8 before this structure is mounted on the circuit board 6. That is, the chips 4, and the circuit lines 10, may be electrically, or otherwise, tested to determine if there are any defects, and a known electric potential can be applied through the circuit lines 10 on the flexible film 2 to selected terminals 18 of the semiconductor chips 4 to supply a desired electric current to the semiconductor chips 4 to perform a type of functional test of the semiconductor chips 4, know as "burn in".

Once the semiconductor chips 4 have been tested and burned in, and any defective chips 4 and/or circuit lines 10 have been located, then the circuitized flexible film 2 with the semiconductor chips 4 is mounted on the circuit board 6 having the bonding sites 25 matching the pattern of the semiconductor chips on the flexible film 2. Of course, if any of the chips 4 were found to be defective then the flexible film 2 is used with a circuit board 6 having functional bonding sites 25 which match up only with functional chips 4 on the circuitized flexible film 2. Alternatively, it may be possible to repair any defective chips 4 and/or circuitry 10 on the flexible film 2 before it is mounted on the circuit board 6. For example, a defective chip 4 may be removed (cut out) and replaced with a functional chip 4. This ability to identify defective chip sites before the flexible film 2 is mounted on the circuit board 6 is an effective way to ensure relatively high yields when manufacturing the electronic packaging structure 1 according to the principles of the present invention.

The circuitized flexible film 2 with the semiconductor chips 4 may be mounted on the printed circuit board 6 using any one of a number of techniques. For example, this flexible film 2 may be mounted on the circuit board 6 using commonly known backbonding and outer lead bonding techniques such as a thermal compression bonding technique used in tape automated bonding (TAB), or other such suitable outer lead bonding technique. Then the frame 8 may be removed from the flexible film 2 by, for example, cutting the frame away from the film 2. Alternatively, the frame 8 may be bonded to a heat sink 20 which is part of the circuit board 6 as described previously.

Several important features of the foregoing described electronic packaging structure 1 and the method for making such a structure 1, should be noted. First, this structure and method provide for relatively high yields when used in manufacturing electronic equipment, such as computers, especially when used in a relatively high volume manufacturing environment. High yield is provided for since the chip sites on the full panel, circuitized flexible film 2 can be standardized for use with any one of a number of different circuit boards 6 designed for using only certain selected chips 4 on the circuitized flexible film 2. Thus, a given circuitized flexible film 2 with semiconductor chips 4 may still be used even if one or more of the chip sites are found to be defective since it may be possible to match the semiconductor chips 4 on the circuitized flexible film 2 with a circuit board 6 which does not need to use the chip site(s) found to be defective.

Also, the packaging structure 1 and method for making such a structure 1 according to the present invention, provide for handling many semiconductor chips 4, or other such electronic devices, at once. That is, several semiconductor chips 4 may be handled at the same time on one full panel, circuitized flexible film 2. This feature of the present invention is very important since it can increase productivity, reduce manufacturing costs, and, in general, make it easier to manufacture electronic equipment, such as computers, especially when it is desired to manufacture such equipment in a relatively high volume manufacturing environment. For example, when handling a full panel of semiconductor chips 4 which are to be mounted on a circuit board 6, the entire panel of the semiconductor chips 4 may be aligned, and placed in registration, with the circuit board 6, in one operation. This eliminates the need to individually align, and place in registration, each of the semiconductor chips 4 with respect to its matching bonding site 25 on the circuit board 6, which otherwise would be necessary if a single chip handling type manufacturing technique was used.

The foregoing described important features and advantages of the electronic packaging structure 1 and method according to the present invention are only a few examples of such features and advantages, and these examples are not intended to be exhaustive. Other such features and advantages will be readily apparent to one of ordinary skill in the art to which the present inveniton pertains.

Also, of course, the foregoing description is directed to one particular embodiment of the present invention and various modifications and other embodiments of the present invention will be apparent to one of ordinary skill in the art to which the present invention pertains. Therefore, while the present invention has been described in conjunction with a particular embodiment it is to be understood that various modifications and other embodiments of the present invention may be made without departing from the scope of the present invention as described herein and as claimed in the appended claims.

What is claimed is:

1. An electronic packaging structure comprising:
    a circuitized substrate having a plurality of bonding sites arranged in a selected pattern on said circuitized substrate;
    a heat sink which is part of the circuitized substrate;
    a thermally conductive frame in thermal contact with the heat sink;
    a flexible sheet of polyimide attached to the thermally conductive frame and mounted on the circuitized substrate, said flexible sheet of polyimide having a thickness of less than approximately 25.0 microns (about 0.001 inch);
    circuitry on at least one side of the flexible sheet of polyimide, said circuitry including electronic device mounting pads, and lands connecting said circuitry to the bonding sites on the circuitized substrate; and
    a plurality of electronic devices mounted on the pads of the circuitry on the flexible sheet of polyimide using controlled collapse chip connections.

2. An electronic packaging structure as recited in claim 1 wherein said circuitized substrate comprises a printed circuit board.

3. An electronic packaging structure as recited in claim 1 wherein each of said electronic devices comprises an integrated circuit chip.

4. An electronic packaging structure comprising:
    a circuitized substrate having a plurality of bonding sites arranged in a selected pattern on said circuitized substrate;
    at least one heat sink which is part of but smaller than the circuitized substrate;
    a flexible sheet of polyimide mounted on the circuitized substrate, said flexible sheet of polyimide having a thickness of less than approximately 25.0 microns (about 0.001 inch);
    circuitry on at least one side of the flexible sheet of polyimide, said circuitry including electronic device mounting pads, and lands connecting said circuitry to the bonding sites on the circuitized substrate; and
    a plurality of electronic devices mounted on the pads of the circuitry on the flexible sheet of polyimide using controlled collapse chip connections, with at least one of said electronic devices in thermal communication with the heat sink which is part of the circuitized substrate.

5. An electronic packaging structure as recited in claim 4 wherein said circuitized substrate comprises a printed circuit board.

6. An electronic packaging structure as recited in claim 4 wherein each of said electronic devices comprises an integrated circuit chip.

7. The electronic packaging structure of claim 4 wherein said at least one heat sink is in physical contact with said flexible sheet of polyimide.

8. The electronic packaging structure of claim 4 wherein said at least one heat sink is on the same side of said circuitized substrate as is the circuitry.

* * * * *